US012787596B2

(12) United States Patent
Yi et al.

(10) Patent No.: US 12,787,596 B2
(45) Date of Patent: Nov. 3, 2026

(54) DISPLAY PANEL, DISPLAY DEVICE, AND ELECTRONIC DEVICE

(71) Applicant: HKC CORPORATION LIMITED, Shenzhen (CN)

(72) Inventors: Wenyu Yi, Shenzhen (CN); Chuan Wu, Shenzhen (CN); Zhonglin Cao, Shenzhen (CN); Yajuan Feng, Shenzhen (CN); Dongmei Wei, Shenzhen (CN); Jie Chen, Shenzhen (CN); Yao Li, Shenzhen (CN); Junfeng Xie, Shenzhen (CN)

(73) Assignee: HKC CORPORATION, Shenzhen (CN)

( * ) Notice: Subject to any disclaimer, the term of this patent is extended or adjusted under 35 U.S.C. 154(b) by 231 days.

(21) Appl. No.: 18/931,066

(22) Filed: Oct. 30, 2024

(65) Prior Publication Data

US 2025/0138379 A1 May 1, 2025

(30) Foreign Application Priority Data

Nov. 1, 2023 (CN) ........................ 202311448898.4

(51) Int. Cl.
*G02F 1/163* (2006.01)
*G02F 1/1333* (2006.01)
(Continued)

(52) U.S. Cl.
CPC ....... *H10K 59/50* (2023.02); *G02F 1/133305* (2013.01); *G02F 1/1533* (2013.01);
(Continued)

(58) Field of Classification Search
CPC ............... G02F 1/163; G02F 1/133305; G02F 1/1533; G02F 1/155; H10K 59/121;
(Continued)

(56) References Cited

U.S. PATENT DOCUMENTS

| | | | | |
|---|---|---|---|---|
| 11,348,983 | B1 | 5/2022 | Choung et al. | |
| 11,552,143 | B1 | 1/2023 | Choung et al. | |
| 11,626,569 | B1 | 4/2023 | Lee et al. | |
| 12,222,624 | B2 * | 2/2025 | Ge | G02F 1/1337 |
| 2021/0223871 | A1 | 7/2021 | Shang et al. | |
| 2021/0407353 | A1 | 12/2021 | Tian et al. | |

FOREIGN PATENT DOCUMENTS

| | | | |
|---|---|---|---|
| CN | 104977762 | A | 10/2015 |
| CN | 108152999 | A | 6/2018 |

(Continued)

OTHER PUBLICATIONS

Chinese Notification to Grant Patent Right for Invention, Chinese Application No. 2023114488984, mailed May 29, 2024 (6 pages).

*Primary Examiner* — Joseph L Williams

(57) ABSTRACT

A display panel, a display device, and an electronic device are disclosed. The display panel includes a flexible substrate, a plurality of pixel islands, an electrochromic layer, and a plurality of force sensors. In response to a stretching length of a corresponding one of a plurality of flexible connection lines being greater than a preset value, each of the plurality of force sensors is configured to enable the electrochromic layer to be switched to a transparent state to allow light emitted from the display panel to pass therethrough. In response to the stretching length of the corresponding one of the plurality of flexible connection lines being less than the preset value, each of the plurality of force sensors is configured to enable the electrochromic layer to be switched to an opaque state to block the light emitted from the display panel.

20 Claims, 3 Drawing Sheets

(51) Int. Cl.

| | |
|---|---|
| ***G02F 1/153*** | (2006.01) |
| ***G02F 1/155*** | (2006.01) |
| ***H10K 59/121*** | (2023.01) |
| ***H10K 59/122*** | (2023.01) |
| ***H10K 59/131*** | (2023.01) |
| ***H10K 59/50*** | (2023.01) |
| ***H10K 59/80*** | (2023.01) |
| ***H10K 77/10*** | (2023.01) |
| ***H10K 102/00*** | (2023.01) |
| *G09G 3/38* | (2006.01) |

(52) U.S. Cl.

CPC .............. *G02F 1/155* (2013.01); *G02F 1/163* (2013.01); *H10K 59/121* (2023.02); *H10K 59/1213* (2023.02); *H10K 59/122* (2023.02); *H10K 59/131* (2023.02); *H10K 59/873* (2023.02); *H10K 77/111* (2023.02); *G02F 2001/1635* (2013.01); *G09G 3/38* (2013.01); *H10K 2102/311* (2023.02)

(58) Field of Classification Search

CPC ............. H10K 59/1213; H10K 59/122; H10K 59/131; H10K 59/50; H10K 59/873; H10K 7/111

See application file for complete search history.

(56) References Cited

FOREIGN PATENT DOCUMENTS

| | | | |
|---|---|---|---|
| CN | 110224077 | A | 9/2019 |
| CN | 110047380 | B | 6/2020 |
| CN | 111326607 | B | 5/2021 |
| CN | 112928149 | A | 6/2021 |
| CN | 113013210 | A | 6/2021 |
| CN | 110164364 | B | 8/2021 |
| CN | 113328049 | A | 8/2021 |
| CN | 113778261 | A | 12/2021 |
| CN | 113971905 | A | 1/2022 |
| CN | 110045824 | B | 6/2022 |
| CN | 111462637 | B | 7/2022 |
| CN | 113471237 | B | 9/2022 |
| CN | 115020445 | A | 9/2022 |
| CN | 115112641 | A | 9/2022 |
| CN | 112736093 | B | 10/2022 |
| CN | 112530864 | B | 11/2022 |
| CN | 115274696 | A | 11/2022 |
| CN | 112134979 | B | 4/2023 |
| CN | 112198707 | B | 4/2023 |
| CN | 113035056 | B | 4/2023 |
| CN | 115918295 | A | 4/2023 |
| CN | 116322179 | A | 6/2023 |
| CN | 116382523 | A | 7/2023 |
| CN | 116469314 | A | 7/2023 |
| KR | 20210124075 | A | 10/2021 |
| WO | 2022051004 | A1 | 3/2022 |

* cited by examiner

DISPLAY PANEL, DISPLAY DEVICE, AND ELECTRONIC DEVICE

CROSS-REFERENCE TO RELATED APPLICATIONS

This application claims priority to Chinese Patent Application No. 202311448898.4, filed on Nov. 1, 2023, in the National Intellectual Property Administration of China, the contents of which are herein incorporated by reference in their entireties.

TECHNICAL FIELD

The present disclosure relates to the field of display technology, and in particular to a display panel, a display device, and an electronic device.

BACKGROUND

With the development of display technology, people are having higher and higher expectation of the display technology and a stretchable display panel has received a widespread attention. A distance between adjacent pixels increases, which may correspondingly decrease a display brightness, in response to a current stretchable display panel being stretched, resulting in a difference in the display brightness before and after the display panel being stretched and negatively affecting user's viewing experience.

SUMMARY OF THE DISCLOSURE

Some embodiments of the present disclosure may provide a display panel, a display device, and an electronic device, in order to address a technical problem of negatively affecting user's viewing experience since a display brightness is different before and after a stretchable display panel is stretched in the related art.

In order to address the technical problem above, a technical solution adopted by the present disclosure provides a display panel. The display panel includes a flexible substrate, a plurality of pixel islands, an electrochromic layer, and a plurality of force sensors. The plurality of pixel islands are disposed on the flexible substrate in array and any adjacent two of the plurality of pixel islands are connected through a corresponding one of a plurality of flexible connection lines. The electrochromic layer is disposed around a periphery of each of the plurality of pixel islands and is configured to be switched between a transparent state and an opaque state. Each of the plurality of force sensors is disposed on a corresponding one of the plurality of flexible connection lines, configured to detect a stretching length of the corresponding one of the plurality of flexible connection lines, and electrically connected to the electrochromic layer. In response to the stretching length of the corresponding one of the plurality of flexible connection lines being greater than a preset value, each of the plurality of force sensors is configured to control or enable the electrochromic layer to be switched to the transparent state to allow light emitted from the display panel to pass therethrough. In response to the stretching length of the corresponding one of the plurality of flexible connection lines being less than the preset value, each of the plurality of force sensors is configured to control or enable the electrochromic layer to be switched to the opaque state to block the light emitted from the display panel.

In order to address the technical problem above, another technical solution adopted by the present disclosure provides a display device that includes the display panel mentioned above.

In order to address the technical problem above, still another technical solution adopted by the present disclosure provides an electronic device that includes the display device mentioned above.

Figure 1:
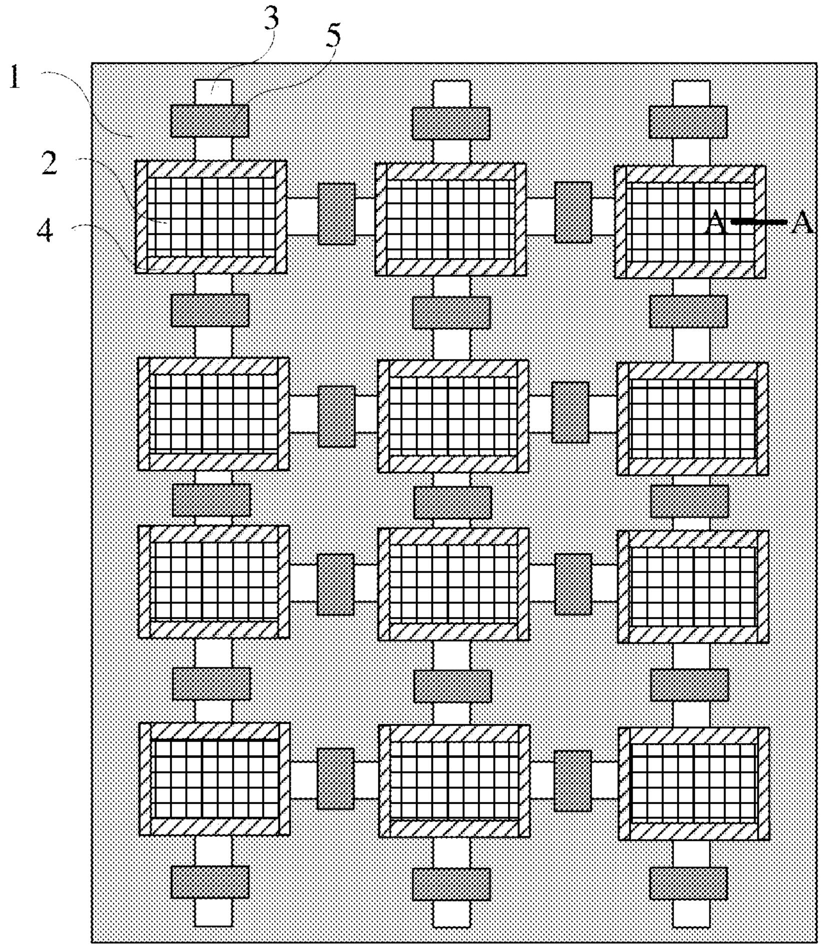
FIG. 1 is a schematic structural view of a display panel according to the first embodiment of the present disclosure.

1, flexible substrate; 2, pixel island; 3, flexible connection line; 4, electrochromic layer; 5, force sensor; 6, common electrode; 7, driving electrode; 8, TFT switch; 9, control unit; 10, driving signal line; 21, driving substrate; 22, pixel defining layer; 23, sub-pixel; 24, organic encapsulation layer; 25, inorganic encapsulation layer; 81, source; 82, drain; 83, gate; 231, anode; 220, pixel accommodating area; 232, light-emitting layer; 233, cathode.

DETAILED DESCRIPTION

The technical solutions in the embodiments of the present disclosure are clearly and thoroughly described below in conjunction with the drawings in the embodiments of the present disclosure. Obviously, the embodiments described are merely a part of the embodiments, rather than all the embodiments, of the present disclosure. Based on the embodiments of the present disclosure, all other embodiments obtained by a person of ordinary skills in the art without creative work fall within the scope of protection of the present disclosure.

The terms "first", "second", and "third" in the present disclosure are used for descriptive purposes only and may not be understood to indicate or imply relative importance or implicitly specify the number of technical features indicated. Thus, a feature defined with the terms "first", "second", and "third" may, either explicitly or implicitly, indicate that at least one such feature is provided. In the description of the present disclosure, "plurality" means at least two, e.g., two, three, and etc., unless otherwise explicitly and specifically indicated. All directional indications (e.g., top, bottom, left, right, front, and back . . . ) in the embodiments of the present disclosure are only used to explain the relative positional relationship, movement, and etc. between the components in a particular positioning (as illustrated in the drawings), and the directional indications may be changed accordingly given the positioning being changed. In addition, the terms "including", "having", and any variations thereof are intended to indicate a non-exclusive inclusion. For example, a process, method, system, product or device including a series of steps or units is not limited to the listed steps or units, but optionally may further include steps or units that are not listed, or other steps or units that are inherent to the process, method, product or device.

References to "embodiment" in the specification of the present disclosure indicate that a particular feature, structure, or characteristics described in conjunction with the embodiment may be provided in one or more embodiments of the present disclosure. The "embodiment" appeared across the specification refers to neither necessarily the identical embodiment, nor a separate or alternate embodiment that is mutually exclusive with other embodiments. It can be understood by the person of ordinary skills in the art, both explicitly and implicitly, that the embodiments described herein may be combined with other embodiments.

In conjunction with the drawings, the implementations according to the embodiments of the present disclosure are described in details as follows.

As illustrated in FIG. 1, FIG. 1 is a schematic structural view of a display panel according to the first embodiment of the present disclosure. Some embodiments of the present disclosure provide a display panel. The display panel may be an organic light-emitting diode (OLED) display panel or a liquid crystal display (LCD) panel, which is stretchable under an external force. The display panel may be stretched and contracted along either a first direction X or a second direction Y. In some embodiments, the display panel may be stretched or contracted two-dimensionally in the first direction X and the second direction Y. The first direction X and the second direction Y may be substantially perpendicular to each other. The following embodiments of the present disclosure are described by taking the OLED display panel as an example.

As illustrated in FIG. 1, the display panel may include a flexible substrate 1, a plurality of pixel islands 2, an electrochromic layer 4, and a plurality of force sensors 5.

The flexible substrate 1 is a stretchable substrate, i.e., is able to be stretched in a particular direction and further restore to a pre-stretch state. The flexible substrate 1 is configured to support and protect each component of the display panel.

The plurality of pixel islands 2 are disposed on the flexible substrate 1 in array and are configured to display. In some embodiments, the plurality of pixel islands 2 are spaced apart from each other on the flexible substrate 1 along each of the first direction X and the second direction Y. Any adjacent two of the plurality of pixel islands 2 are connected through a corresponding one of a plurality of flexible connection lines 3. In response to the display panel being stretched, the corresponding one of the plurality of flexible connection lines 3 is stretched along with the flexible substrate 1 located between the adjacent two of the plurality of pixel islands 2.

The electrochromic layer 4 is disposed around a periphery of each of the plurality of pixel islands 2 and may be configured to be switched between a transparent state and an opaque state under an action of an applied electric field. In some embodiments, in response to a voltage difference existing between two sides of the electrochromic layer 4, i.e., two sides of the electrochromic layer 4 along a direction in which the display panel is stretched, the electrochromic layer 4 is switched to the transparent state so that light is allowed to pass through the electrochromic layer 4. In some embodiments, in response to no voltage difference existing between the two sides of the electrochromic layer 4, the electrochromic layer 4 is switched to the opaque state, i.e., a color of the electrochromic layer 4 turns black, so that the light is not allowed to pass through the electrochromic layer 4.

Each of the plurality of force sensors 5 is disposed on a corresponding one of the plurality of flexible connection lines 3 and is configured to detect a stretching length of the corresponding one of the plurality of flexible connection lines 3. The stretching length may refer to a length difference of the corresponding one of the plurality of flexible connection lines 3 before and after the corresponding one of the plurality of flexible connection lines 3 being stretched. Each of the plurality of force sensors 5 may be a tension sensor or a pressure sensor. In some embodiments, each of the plurality of force sensors 5 is a tension sensor. It is to be understood that, in response to each of the plurality of flexible connection lines 3 being stretched and deformed, a tension force of each of the plurality of flexible connection lines 3 on a corresponding one of the plurality of force sensors 5 along the first direction X and/or the second direction Y may change correspondingly. A magnitude of the tension force corresponds to the stretching length. Each of the plurality of force sensors 5 may determine the stretching length based on the magnitude of the detected tension force. Each of the plurality of force sensors 5 is electrically connected to the electrochromic layer 4 to control the voltage difference between the two sides of the electrochromic layer 4.

In response to the stretching length of one of the plurality of flexible connection lines 3 being greater than a preset value, a corresponding one of the plurality of force sensors 5 is configured to control or enable the electrochromic layer 4 to be switched to the transparent state so that light emitted from the display panel may pass through the electrochromic layer 4. In response to the stretching length of the one of the plurality of flexible connection lines 3 being less than the preset value, the corresponding one of the plurality of force sensors 5 is configured to control or enable the electrochromic layer 4 to be switched to the opaque state to block the light emitted from the display panel.

It is to be understood that, in the related art, in response to a display panel being stretched, a distance between any adjacent two of the plurality of pixel islands 2 along a direction in which the display panel is stretched increases, which causes a brightness of the display panel to decrease. Some embodiments of the present disclosure dispose the electrochromic layer 4 around the periphery of each of the plurality of pixel islands 2, which allows a light transmittance capacity of the display panel to be increased through changing the color of the electrochromic layer 4 after the display panel being stretched, thereby improving the brightness of the display panel, avoiding a display non-uniformity before and after the display panel being stretched, and effectively improving the user experience. In addition, each of the plurality of force sensors 5 is disposed on the corresponding one of the plurality of flexible connection lines 3 located between the adjacent two of the plurality of pixel islands 2. The electrochromic layer 4 is configured to switch between the transparent state and the opaque state based on the stretching length of the corresponding one of the plurality of flexible connection lines 3, thereby allowing the light transmittance capacity of the electrochromic layer 4 to be changed correspondingly.

Figure 2:
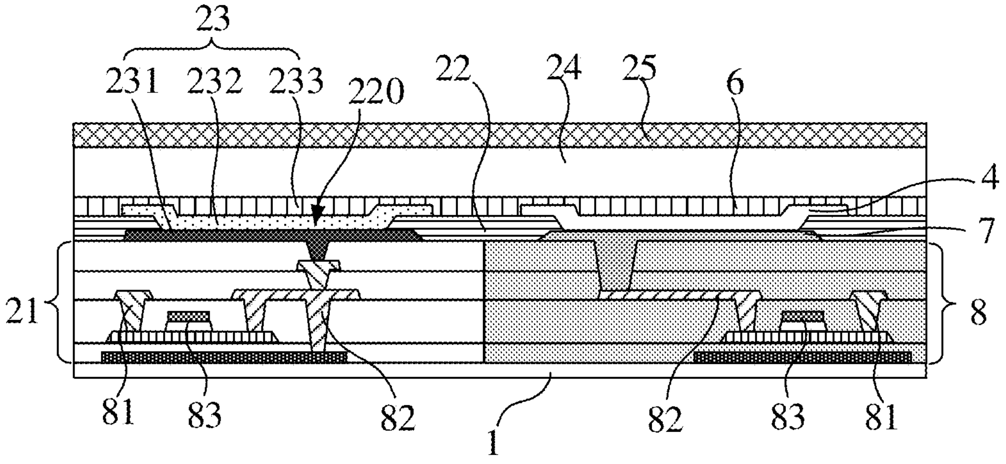
FIG. 2 is a schematic section view of the display panel illustrated in FIG. 1 along an A-A line.

As illustrated in FIG. 2, FIG. 2 is a schematic section view of the display panel illustrated in FIG. 1 along an A-A line. In some embodiments, the display panel may further include a common electrode 6, a driving electrode 7, a driving signal line 10, and a TFT switch 8.

The common electrode 6 is disposed on a surface of a side of the electrochromic layer 4 and the driving electrode 7 is disposed on a surface of another side of the electrochromic layer 4 away from the common electrode 6. Each of the common electrode 6 and the driving electrode 7 is electrically connected to the electrochromic layer 4 and is configured to apply an electric field to the electrochromic layer 4 so that the electrochromic layer 4 may be switched between different states. In some embodiments, each of the common electrode 6 and the driving electrode 7 may be an indium-tin-oxide (ITO) transparent electrode. The common electrode 6, as a cathode of the electrochromic layer 4, is conducted to ground. The driving electrode 7, as an anode of the electrochromic layer 4, is electrically connected to the driving signal line 10. The driving signal line 10 is configured to transmit a driving signal to the driving electrode 7 to generate the electric field between the common electrode 6 and the driving electrode 7, thereby realizing the voltage difference between the two sides of the electrochromic layer 4. It is to be understood that, in case of no driving signal being transmitted to the driving electrode 7, no voltage difference exists between the two sides of the electrochromic layer 4 and the electrochromic layer 4 is in the transparent state. In case of the driving signal being transmitted to the driving electrode 7, the voltage difference exists between the two sides of the electrochromic layer 4 and the electrochromic layer 4 is in the opaque state.

The TFT switch 8 is configured to control the driving signal transmitted to the electrochromic layer 4. In some embodiments, the TFT switch 8 is a P-type thin film transistor. That is, the TFT switch 8 includes a source 81, a drain 82, and a gate 83. The source 81 is electrically connected to the driving signal line 10 and the drain 82 is electrically connected to the driving electrode 7. In case of no voltage signal being transmitted to the gate 83, a carrier may circulate in a channel between the source 81 and the drain 82 so that the source 81 is electrically conducted to the drain 82, i.e., the TFT switch 8 is turned on. In response to an external voltage signal being transmitted to the gate 83, the gate 83 is turned off so that the source 81 is not conducted to or is disconnected from the drain 82, i.e., the TFT switch 8 is turned off.

In some embodiments, in response to the electrochromic layer 4 being required to be switched to the opaque state, the TFT switch 8 is turned on to allow the driving signal to be transmitted to the driving electrode 7. In response to the electrochromic layer 4 being required to be switched to the transparent state, the TFT switch 8 is turned off to stop the driving signal from being transmitted to the driving electrode 7. In some embodiments, in response to the TFT switch 8 being turned on, the driving signal is transmitted to the driving electrode 7 from the driving signal line 10 through the source 81 and the drain 82 so that the voltage difference is generated between the two sides of the electrochromic layer 4 and the electrochromic layer 4 is switched to the opaque state. In response to the TFT switch 8 being turned off, the driving signal is stopped from being transmitted to the driving electrode 7 so that no voltage difference exists between the two sides of the electrochromic layer 4 and the electrochromic layer 4 is switched to the transparent state.

Figure 3:
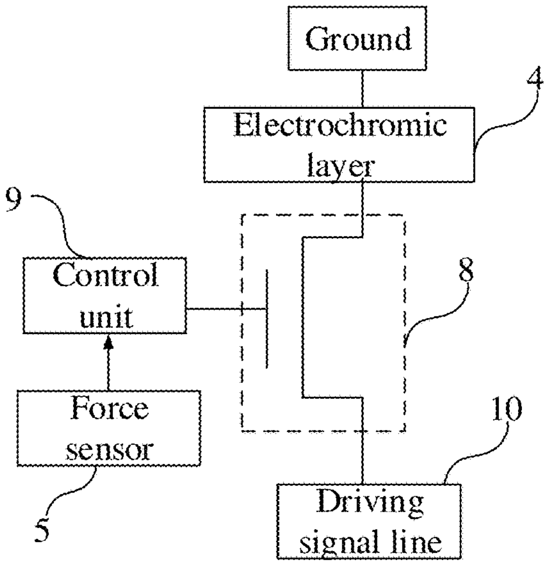
FIG. 3 is a schematic control diagram of a thin film transistor (TFT) switch.

Moreover, as illustrated in FIG. 2 and FIG. 3, FIG. 3 is a schematic control diagram of the TFT switch 8. In some embodiments, the display panel may further include a control unit 9. The control unit 9 is configured to control the voltage signal transmitted to the gate 83 of the TFT switch 8 based on a detection result of a corresponding one of the plurality of force sensors 5. In some embodiments, an end of the control unit 9 is electrically connected to the corresponding one of the plurality of force sensors 5 and is configured to receive an electrical signal transmitted from the corresponding one of the plurality of force sensors 5 in response to the corresponding one of the plurality of force sensors 5 detecting the stretched length of a corresponding one of the plurality of flexible connection lines 3. The other end of the control unit 9 is electrically connected to the gate 83 of the TFT switch 8 and is configured to control the voltage signal transmitted to the gate 83, which allows the TFT switch 8 to be switched between an on state and an off state.

In some embodiments, in response to the stretching length of the corresponding one of the plurality of flexible connection lines 3 being greater than the preset value, the control unit 9 may apply a voltage to the gate 83 of the TFT switch 8 to turn off the TFT switch 8 and stop the driving signal from being transmitted to the driving electrode 7, which enables the electrochromic layer 4 to be switched to the transparent state. In response to the stretching length of the corresponding one of the plurality of flexible connection lines 3 being less than the preset value, the control unit 9 may stop applying the voltage to the gate 83 of the TFT switch 8 so that the TFT switch 8 is turned on and allows the driving signal to be transmitted to the driving electrode 7, which enables the electrochromic layer 4 to be switched to the opaque state.

In some embodiments, the preset value determined for each of the plurality of force sensors 5 may be one-third of a length of the corresponding one of the plurality of flexible connection lines 3. That is, in response to each of the plurality of force sensors 5 detecting that the stretched length of the corresponding one of the plurality of flexible connection lines 3 is greater than one-third of the length of the corresponding one of the plurality of flexible connection lines 3 before being stretched, the electrochromic layer 4 is controlled or enabled to be switched to the transparent state. In response to each of the plurality of force sensors 5 detecting that the stretched length of the corresponding one of the plurality of flexible connection lines 3 is less than one-third of the length of the corresponding one of the plurality of flexible connection lines 3 before being stretched, the electrochromic layer 4 is controlled or enabled to be switched to the opaque state.

Figure 4:
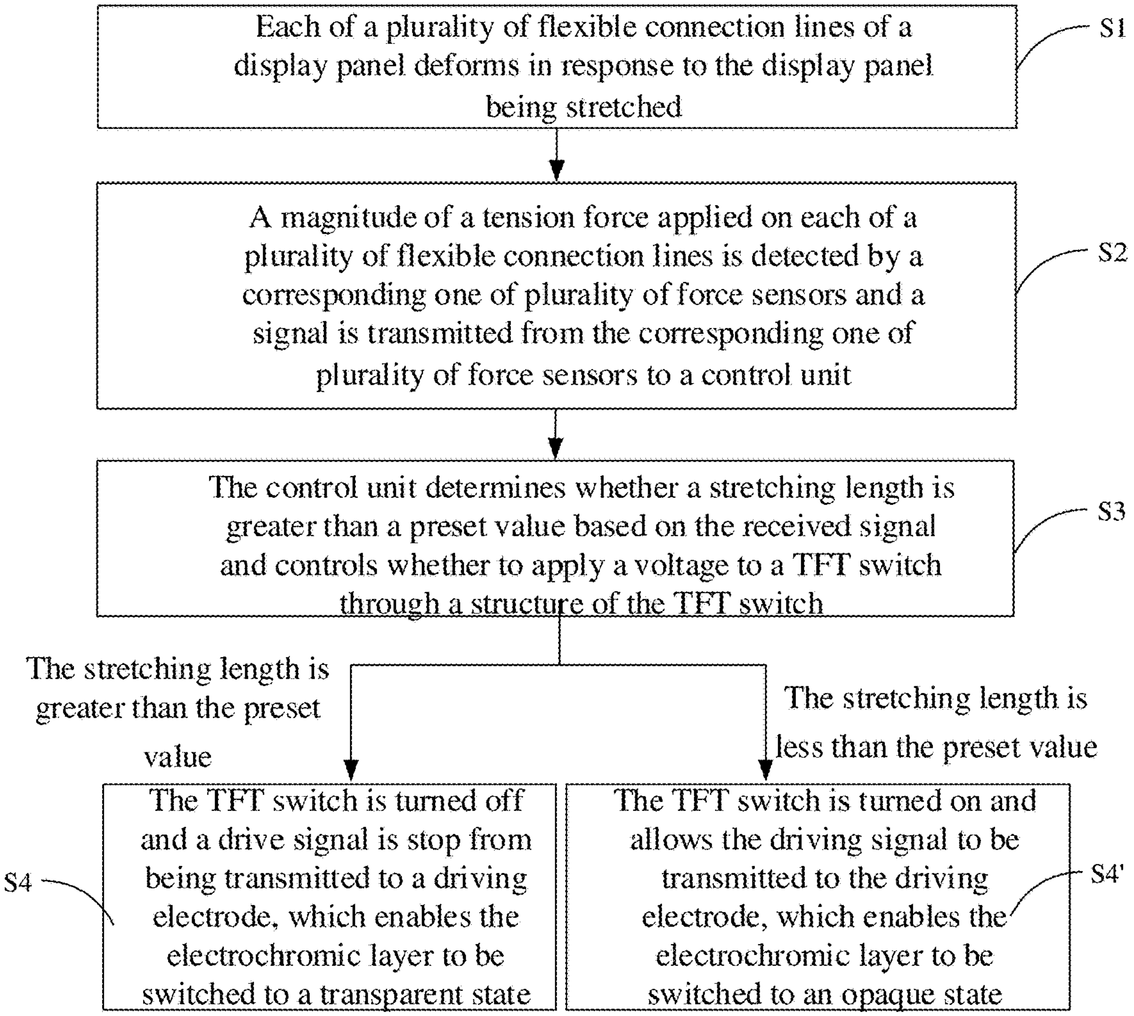
FIG. 4 is a flowchart of operations of an electrochromic layer.

As illustrated in FIG. 4, FIG. 4 is a flowchart of operations of the electrochromic layer 4. In some embodiments, the electrochromic layer 4 may be operated as follows.

At operation S1: each of a plurality of flexible connection lines 3 of a display panel deforms in response to the display panel being stretched.

At operation S2: a magnitude of a tension force applied on each of a plurality of flexible connection lines 3 is detected by a corresponding one of plurality of force sensors 5 and a signal is transmitted from the corresponding one of plurality of force sensors 5 to a control unit.

At operation S3: the control unit determines whether a stretching length is greater than a preset value based on the received signal and controls whether to apply a voltage to a TFT switch through a determination result.

In some embodiments, in response to the control unit 9 determining that the stretching length of the corresponding one of the plurality of flexible connection lines 3 is greater than the preset value, the control unit 9 controls the voltage signal to be transmitted to the gate 83 of the TFT switch 8 to turn off the TFT switch 8. In response to the control unit 9 determining that the stretching length of one of the plurality of flexible connection lines 3 is less than the preset value, the control unit 9 stops the voltage signal from being transmitted to the gate 83 to turn on the TFT switch 8.

In an implementation, in response to the stretching length being greater than the preset value, the display panel may be operated as follows.

At operation S4: the TFT switch is turned off and a driving signal is stop from being transmitted to a driving electrode, which enables the electrochromic layer to be switched to a transparent state.

In the implementation, in response to the stretching length being less than the preset value, the display panel may be operated as follows.

At operation S4': the TFT switch is turned on and allows the driving signal to be transmitted to the driving electrode, which enables the electrochromic layer to be switched to an opaque state.

It is to be understood that, during the stretch of the display panel, a distance between any adjacent two of the plurality of pixel islands 2 in different areas may be different and the stretching length of each of the plurality of flexible connection lines 3 may be different. Each of the plurality of force sensors 5 only detects the stretching length of the corresponding one of the plurality of flexible connection lines 3 and is only electrically connected to the electrochromic layer 4 located close to the plurality of force sensors 5 on the adjacent two of the plurality of pixel islands 2 to control the electrochromic layer 4 located close to the plurality of force sensors 5 on the adjacent two of the plurality of pixel islands 2 to be switched between the transparent state and the opaque state.

As illustrated in FIG. 2, each of the plurality of pixel islands 2 further includes a driving substrate 21, a pixel defining layer 22, and a plurality of sub-pixels 23. The driving substrate 21 is disposed on the flexible substrate 1 and is configured to drive the plurality of sub-pixels 23 to emit light. The pixel defining layer 22 is disposed on a surface of a side of the driving substrate 21 away from the flexible substrate 1 and protrudes from the driving substrate 21 to define a plurality of pixel accommodating areas 220. The plurality of pixel accommodating areas 220 are configured to accommodate the plurality of sub-pixels 23.

Each of the plurality of sub-pixels 23 is disposed in a corresponding one of the plurality of pixel accommodating areas 220 and is electrically connected to the driving substrate 21. The driving substrate 21 is configured to drive the plurality of sub-pixels 23 to emit light. In some embodiments, each of the plurality of sub-pixels 23 includes an anode 231, a light-emitting layer 232, and a cathode 233 disposed on the driving substrate 21 in sequence along a direction away from the driving substrate 21. In some embodiments, the light-emitting layer 232 may be an organic light-emitting layer. The anode 231 is connected to an anode power line and the cathode 233 is connected to a cathode power line, which allows the light-emitting layer 232 to be conducted to emit light.

The person of ordinary skills in the art may understand that, the TFT switch 8 and the driving substrate 21 are disposed on the same layer, which facilitates preparing each of the TFT switch 8 and the driving substrate 21 as a multilayer structure of a semiconductor device. In some embodiments, each of the source 81 and the drain 82 of the TFT switch 8 is disposed on the same layer as each of the source 81 and the drain 82 of the driving substrate 21, which reduces extra masks to form the source 81 and the drain 82 of the TFT switch 8. The gate 83 of the TFT switch 8 is disposed on the same layer as the gate 83 of the driving substrate 21, which reduces extra masks to form the gate 83 of the TFT switch 8. In this way, through forming the TFT switch 8 and masking the driving substrate 21 at the same time, the number of masks may be reduced and a manufacturing cost of the display panel may be effectively saved.

In some embodiments, each of the plurality of force sensors 5 is disposed on the same layer as the TFT switch 8 and is electrically connected to the gate 83 of the TFT switch 8 on each of the adjacent two of the plurality of pixel islands 2, thereby facilitating the signal transmitted from each of the plurality of force sensors 5 to be transmitted to the gate 83 of the TFT switch 8 located on the same layer through a sense line.

As illustrated in FIG. 2, in some embodiments, the electrochromic layer 4 and the plurality of sub-pixels 23 are disposed on the same layer. In some embodiments, the driving electrode 7 and the anode 231 of each of the sub-pixels 23 are disposed on the same layer and the pixel defining layer 22 is disposed between the anode 231 of each of the sub-pixels 23 and the driving electrode 7. In this way, the anode 231 of each of the sub-pixels 23 is spaced apart from the driving electrode 7, thereby avoiding the anode 231 of each of the sub-pixels 23 from being conducted to the driving electrode 7, which may affect the control of the TFT switch 8 to the driving signal of the driving electrode 7. In some embodiments, a side of the pixel defining layer 22 covers part of the anode 231 and another side of the pixel defining layer 22 covers part of driving electrode 7.

In some embodiments, the driving electrode 7 is disposed on a surface of a side of the TFT switch 8 away from the flexible substrate 1 and is electrically connected to the drain 82 of the TFT switch 8 through a pin.

The electrochromic layer 4 is located on a surface of a side of the driving electrode 7 away from the TFT switch 8 and is disposed on the same layer as the light-emitting layer 232 of the each of the plurality of sub-pixels 23. The pixel defining layer 22 is disposed between the light-emitting layer 232 and the electrochromic layer 4 so that the light-emitting layer 232 is spaced apart from the electrochromic layer 4. The electrochromic layer 4 completely covers the driving electrode 7 to avoid the common electrode 6 from being in contact with and conducted to the driving electrode 7 during a subsequent evaporation process. In some embodiments, the electrochromic layer 4 may cover part of the pixel defining layer 22.

The common electrode 6 is disposed on a surface of the electrochromic layer 4 away from the driving electrode 7. The cathode 233 of each of the plurality of sub-pixels 23 and the common electrode 6 are formed by the same film layer. That is, the electrochromic layer 4 and each of the plurality of sub-pixels 23 share a common cathode 233, which allows the common electrode 6 and the cathode 233 to be formed at the same time and saves the manufacturing cost.

Figure 5:
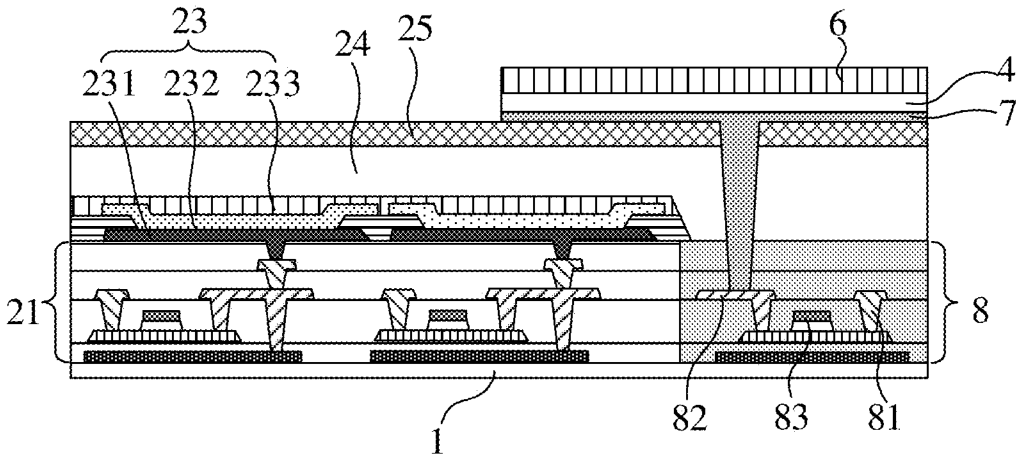
FIG. 5 is a schematic section view of a display panel along an A-A line according the second embodiment of the present disclosure.

As illustrated in FIG. 5, FIG. 5 is a schematic section view of a display panel along an A-A line according the second embodiment of the present disclosure. A structure of a display panel according to the second embodiment of the present disclosure is essentially or substantially identical to the structure of the display panel according to the first embodiment of the present disclosure, except for a difference in that the electrochromic layer 4 and the plurality of sub-pixels 23 are disposed on different layers according to the second embodiment. In other words, the electrochromic layer 4 is disposed on a side of each of the plurality of pixel islands 2 away from the flexible substrate 1 and covers the periphery of each of the plurality of pixel islands 2.

The driving electrode 7 is located on a side of the plurality of pixel islands 2 away from the driving substrate 21. In some embodiments, each of the plurality of pixel islands 2 may further include an organic encapsulation layer 24 that covers or is coated on a side of the cathode 233 away from the driving substrate 21 and an inorganic encapsulation layer 25 that covers or is coated on a side of the organic encapsulation layer 24 away from the driving substrate 21. The organic encapsulation layer 24 and the inorganic encapsulation layer 25 are configured to protect the plurality of sub-pixels 23.

An opening for pin routing is defined on each of the plurality of pixel islands 2 and penetrates through the organic encapsulation layer 24, the inorganic encapsulation layer 25, and the pixel defining layer 22. The driving electrode 7 is disposed on a first side surface of the inorganic encapsulation layer 25 away from the driving substrate 21 and is electrically connected to the drain 82 of the TFT switch 8 through the pin, thereby realizing a driving signal transmission.

Some embodiments of the present disclosure provide a display panel. The display panel includes a flexible substrate 1, a plurality of pixel islands 2, an electrochromic layer 4, and a plurality of force sensors 5. The plurality of pixel islands 2 are disposed on the flexible substrate 1 in array. Any adjacent two of the plurality of pixel islands 2 are connected through a corresponding one of a plurality of flexible connection lines 3. The electrochromic layer 4 is disposed around a periphery of each of the plurality of pixel islands 2 and is configured to be switched between a transparent state and an opaque state. Each of the plurality of force sensors 5 is disposed on a corresponding one of the plurality of flexible connection lines 3 and is configured to detect a stretching length of the corresponding one of the plurality of flexible connection lines 3. Each of the plurality of force sensors 5 is electrically connected to the electrochromic layer 4. In response to the stretching length of one of the plurality of flexible connection lines 3 being greater than a preset value, a corresponding one of the plurality of force sensors 5 is configured to switch the electrochromic layer 4 to the transparent state to allow light emitted from the display panel to pass through the electrochromic layer 4. In response to the stretching length of the one of the plurality of flexible connection lines 3 being less than the preset value, the corresponding one of the plurality of force sensors 5 is configured to switch the electrochromic layer 4 to the opaque state to block the light emitted from the display panel. It is to be understood that, in response to a display panel being stretched, a distance between any adjacent two of the plurality of pixel islands 2 increases, which causes a brightness of the display panel to decrease. Some embodiments of the present disclosure dispose the electrochromic layer 4 around the periphery of each of the plurality of pixel islands 2, which allows a light transmittance capacity of the display panel to be increased through changing the color of the electrochromic layer 4 after the display panel being stretched, thereby improving the brightness of the display panel, avoiding a display non-uniformity before and after the display panel being stretched, and effectively improving the user experience. In addition, each of the plurality of force sensors 5 is disposed on the corresponding one of the plurality of flexible connection lines 3 located between corresponding adjacent two of the plurality of pixel islands 2. The electrochromic layer 4 is configured to be switched between the transparent state and the opaque state based on the stretching length of the corresponding one of the plurality of flexible connection lines 3, thereby allowing the light transmittance capacity of the electrochromic layer 4 to be changed correspondingly.

Some embodiments of the present disclosure further provide a display device. The display device may include the display panel in any one of the embodiments mentioned above. The specific structure and functionality of the display panel may refer to the relevant description above and will not be repeated herein. The display device may be a cellphone, a tablet computer, a laptop computer, a television, and any other products or components with a display function. The display device further includes a motherboard, a control circuit, and etc., which are identical or similar to relevant structures in the existing display panel, and thus further details may refer to the related art and will not be repeated herein.

Some embodiments of the present disclosure may further an electronic device. The electronic device may include the display device mentioned above.

The above only describes the implementations of the present disclosure, and is not intended to limit the scope of protection of the present disclosure. Any equivalent structure or process alternations based on the specification of present application and the drawings, and their direct or indirect application in other related technical fields, are all similarly included in the scope of protection of the present disclosure.

What is claimed is:

1. A display panel, comprising:

a flexible substrate;

a plurality of pixel islands, disposed on the flexible substrate in array, wherein any adjacent two of the plurality of pixel islands are connected through a corresponding one of a plurality of flexible connection lines;

an electrochromic layer, disposed around a periphery of each of the plurality of pixel islands, wherein the electrochromic layer is configured to be switched between a transparent state and an opaque state; and a plurality of force sensors, wherein each of the plurality of force sensors is disposed on a corresponding one of the plurality of flexible connection lines, configured to detect a stretching length of the corresponding one of the plurality of flexible connection lines, and electrically connected to the electrochromic layer;

wherein in response to the stretching length of the corresponding one of the plurality of flexible connection lines being greater than a preset value, each of the plurality of force sensors is configured to enable the electrochromic layer to be switched to the transparent state to allow light emitted from the display panel to pass therethrough; and wherein in response to the stretching length of the corresponding one of the plurality of flexible connection lines being less than the preset value, each of the plurality of force sensors is configured to enable the electrochromic layer to be switched to the opaque state to block the light emitted from the display panel.

2. The display panel according to claim 1, further comprising:

a common electrode, disposed on a surface of a side of the electrochromic layer and electrically connected to the electrochromic layer;

a driving electrode, disposed on a surface of another side of the electrochromic layer away from the common electrode and electrically connected to the electrochromic layer;

a driving signal line, configured to transmit a driving signal to the driving electrode to generate an electric field between the common electrode and the driving electrode; and a thin film transistor (TFT) switch, comprising a source electrically connected to the driving signal line and a drain electrically connected to the driving electrode, wherein the TFT switch is configured to control the driving signal transmitted to the electrochromic layer;

wherein in response to the electrochromic layer being required to be switched to the opaque state, the TFT switch is turned on to allow the driving signal to be transmitted to the driving electrode; and wherein in response to the electrochromic layer being required to be switched to the transparent state, the TFT switch is turned off to stop the driving signal from being transmitted to the driving electrode.

3. The display panel according to claim 2, wherein each of the plurality of pixel islands comprises a driving substrate, a pixel defining layer, and a plurality of sub-pixels;

each of the plurality of sub-pixels comprises an anode, a light-emitting layer, and a cathode disposed on the driving substrate in sequence along a direction away from the driving substrate; and the TFT switch and the driving substrate are disposed on the same layer.

4. The display panel according to claim 3, wherein the pixel defining layer is disposed on a surface of a side of the driving substrate away from the flexible substrate and protrudes from the driving substrate to define a plurality of pixel accommodating areas; and the plurality of pixel accommodating areas are configured to accommodate the plurality of sub-pixels.

5. The display panel according to claim 3, wherein the electrochromic layer and the plurality of sub-pixels are disposed on the same layer, the anode and the driving electrode are spaced apart by the pixel defining layer, and the light-emitting layer and the electrochromic layer are spaced apart by the pixel defining layer;

the driving electrode is located on a surface of a side of the TFT switch away from the flexible substrate; and the common electrode and the cathode are formed by the same film layer.

6. The display panel according to claim 3, wherein a side of the pixel defining layer covers part of the anode and another side of the pixel defining layer covers part of driving electrode.

7. The display panel according to claim 3, wherein the each of the plurality of pixel islands further comprises an organic encapsulation layer that covers a side of the cathode away from the driving substrate and an inorganic encapsulation layer that covers a side of the organic encapsulation layer away from the driving substrate.

8. The display panel according to claim 3, wherein the electrochromic layer and the plurality of sub-pixels are disposed on different layers and the electrochromic layer covers the periphery of each of the plurality of pixel islands; and the driving electrode is located on a side of the plurality of pixel islands away from the driving substrate and is electrically connected to the drain of the TFT switch through an opening defined on and penetrating each of the plurality of pixel islands.

9. The display panel according to claim 3, wherein each of the plurality of the force sensors and is disposed on the same layer as the TFT switch and is electrically connected to the gate of the TFT switch on each of the adjacent two of the plurality of pixel islands.

10. The display panel according to claim 9, further comprising:

a control unit, an end of the control unit being electrically connected to a corresponding one of the plurality of force sensors and configured to receive an electrical signal transmitted from the corresponding one of the plurality of force sensors, the other end of the control unit being electrically connected to the gate of the TFT switch and configured to control a voltage signal transmitted to the gate of the TFT switch, and the TFT switch being a P-type thin film transistor;

wherein in response to the stretching length of the corresponding one of the plurality of flexible connection lines being greater than the preset value, the control unit is configured to apply a voltage to the gate of the TFT switch to turn off the TFT switch; and wherein in response to the stretching length of the corresponding one of the plurality of flexible connection lines being less than the preset value, the control unit is configured to stop applying the voltage to the gate of the TFT switch to turn on the TFT switch.

11. The display panel according to claim 3, wherein each of the source and the drain of the TFT switch is disposed on the same layer as each of the source and the drain of the driving substrate.

12. The display panel according to claim 1, wherein the preset value determined for each of the plurality of force sensors is one-third of a length of the corresponding one of the plurality of flexible connection lines.

13. A display device, comprising a display panel, wherein the display panel comprises:

a flexible substrate;

a plurality of pixel islands, disposed on the flexible substrate in array, wherein any adjacent two of the plurality of pixel islands are connected through a corresponding one of a plurality of flexible connection lines;

an electrochromic layer, disposed around a periphery of each of the plurality of pixel islands, wherein the electrochromic layer is configured to be switched between a transparent state and an opaque state; and a plurality of force sensors, wherein each of the plurality of force sensors is disposed on a corresponding one of the plurality of flexible connection lines, configured to detect a stretching length of the corresponding one of the plurality of flexible connection lines, and electrically connected to the electrochromic layer;

wherein in response to the stretching length of the corresponding one of the plurality of flexible connection lines being greater than a preset value, each of the plurality of force sensors is configured to enable the electrochromic layer to be switched to the transparent state to allow light emitted from the display panel to pass therethrough; and wherein in response to the stretching length of the corresponding one of the plurality of flexible connection lines being less than the preset value, each of the plurality of force sensors is configured to enable the electrochromic layer to be switched to the opaque state to block the light emitted from the display panel.

14. The display device according to claim 13, wherein the display panel further comprises:

a common electrode, disposed on a surface of a side of the electrochromic layer and electrically connected to the electrochromic layer;

a driving electrode, disposed on a surface of another side of the electrochromic layer away from the common electrode and electrically connected to the electrochromic layer;

a driving signal line, configured to transmit a driving signal to the driving electrode to generate an electric field between the common electrode and the driving electrode; and a thin film transistor (TFT) switch, comprising a source electrically connected to the driving signal line and a drain electrically connected to the driving electrode, wherein the TFT switch is configured to control the driving signal transmitted to the electrochromic layer;

wherein in response to the electrochromic layer being required to be switched to the opaque state, the TFT switch is turned on to allow the driving signal to be transmitted to the driving electrode; and wherein in response to the electrochromic layer being required to be switched to the transparent state, the TFT switch is turned off to stop the driving signal from being transmitted to the driving electrode.

15. The display device according to claim 14, wherein each of the plurality of pixel islands comprises a driving substrate, a pixel defining layer, and a plurality of sub-pixels;

each of the plurality of sub-pixels comprises an anode, a light-emitting layer, and a cathode disposed on the driving substrate in sequence along a direction away from the driving substrate; and the TFT switch and the driving substrate are disposed on the same layer.

16. The display device according to claim 13, wherein the preset value determined for each of the plurality of force sensors is one-third of a length of the corresponding one of the plurality of flexible connection lines.

17. An electronic device, comprising a display device, wherein the display device comprises a display panel and the display panel comprises:

a flexible substrate;

a plurality of pixel islands, disposed on the flexible substrate in array, wherein any adjacent two of the plurality of pixel islands are connected through a corresponding one of a plurality of flexible connection lines;

an electrochromic layer, disposed around a periphery of each of the plurality of pixel islands, wherein the electrochromic layer is configured to be switched between a transparent state and an opaque state; and a plurality of force sensors, wherein each of the plurality of force sensors is disposed on a corresponding one of the plurality of flexible connection lines, configured to detect a stretching length of the corresponding one of the plurality of flexible connection lines, and electrically connected to the electrochromic layer;

wherein in response to the stretching length of the corresponding one of the plurality of flexible connection lines being greater than a preset value, each of the plurality of force sensors is configured to enable the electrochromic layer to be switched to the transparent state to allow light emitted from the display panel to pass therethrough; and wherein in response to the stretching length of the corresponding one of the plurality of flexible connection lines being less than the preset value, each of the plurality of force sensors is configured to enable the electrochromic layer to be switched to the opaque state to block the light emitted from the display panel.

18. The electronic device according to claim 17, wherein the display panel further comprises:

a common electrode, disposed on a surface of a side of the electrochromic layer and electrically connected to the electrochromic layer;

a driving electrode, disposed on a surface of another side of the electrochromic layer away from the common electrode and electrically connected to the electrochromic layer;

a driving signal line, configured to transmit a driving signal to the driving electrode to generate an electric field between the common electrode and the driving electrode; and a thin film transistor (TFT) switch, comprising a source electrically connected to the driving signal line and a drain electrically connected to the driving electrode, wherein the TFT switch is configured to control the driving signal transmitted to the electrochromic layer;

wherein in response to the electrochromic layer being required to be switched to the opaque state, the TFT switch is turned on to allow the driving signal to be transmitted to the driving electrode; and wherein in response to the electrochromic layer being required to be switched to the transparent state, the TFT switch is turned off to stop the driving signal from being transmitted to the driving electrode.

19. The electronic device according to claim 18, wherein each of the plurality of pixel islands comprises a driving substrate, a pixel defining layer, and a plurality of sub-pixels;

each of the plurality of sub-pixels comprises an anode, a light-emitting layer, and a cathode disposed on the driving substrate in sequence along a direction away from the driving substrate; and the TFT switch and the driving substrate are disposed on the same layer.

20. The electronic device according to claim 17, wherein the preset value determined for each of the plurality of force sensors is one-third of a length of the corresponding one of the plurality of flexible connection lines.

* * * * *